(12) United States Patent
Letavic et al.

(10) Patent No.: US 7,989,881 B2
(45) Date of Patent: Aug. 2, 2011

(54) SEMICONDUCTOR DEVICE STRUCTURE WITH A TAPERED FIELD PLATE AND CYLINDRICAL DRIFT REGION GEOMETRY

(75) Inventors: Theodore Letavic, Putnam Valley, NY (US); John Petruzzello, Carmel, NY (US)

(73) Assignee: NXP B.V., Eindhoven (NL)

( * ) Notice: Subject to any disclaimer, the term of this patent is extended or adjusted under 35 U.S.C. 154(b) by 751 days.

(21) Appl. No.: 11/815,861

(22) PCT Filed: Feb. 7, 2006

(86) PCT No.: PCT/IB2006/050398
§ 371 (c)(1),
(2), (4) Date: May 12, 2008

(87) PCT Pub. No.: WO2006/085267
PCT Pub. Date: Aug. 17, 2006

(65) Prior Publication Data
US 2008/0272428 A1    Nov. 6, 2008

Related U.S. Application Data

(60) Provisional application No. 60/651,105, filed on Feb. 8, 2005, provisional application No. 60/737,718, filed on Nov. 17, 2005.

(51) Int. Cl.
*H01L 29/66* (2006.01)

(52) U.S. Cl. .......................... 257/330; 257/328; 257/329
(58) Field of Classification Search .................. 257/330, 257/262, E29.256
See application file for complete search history.

(56) References Cited

U.S. PATENT DOCUMENTS

| | | | | | |
|---|---|---|---|---|---|
| 4,284,997 | A | * | 8/1981 | Nishizawa | 257/264 |
| 4,890,144 | A | * | 12/1989 | Teng et al. | 257/66 |
| 5,122,848 | A | * | 6/1992 | Lee et al. | 257/265 |
| 6,191,447 | B1 | * | 2/2001 | Baliga | 257/330 |
| 6,392,273 | B1 | * | 5/2002 | Chang | 257/330 |
| 6,555,873 | B2 | * | 4/2003 | Disney et al. | 257/342 |
| 2002/0066926 | A1 | * | 6/2002 | Hshieh et al. | 257/330 |
| 2003/0197220 | A1 | * | 10/2003 | Disney | 257/328 |
| 2008/0128743 | A1 | * | 6/2008 | Letavic et al. | 257/139 |
| 2010/0096692 | A1 | * | 4/2010 | Saito et al. | 257/330 |
| 2010/0151643 | A1 | * | 6/2010 | Hirler | 438/270 |

* cited by examiner

*Primary Examiner* — N Drew Richards
*Assistant Examiner* — Grant S Withers

(57) ABSTRACT

A vertically oriented self terminating semiconductor device such as a discrete trench MOS device (10, 38) that includes a cylindrical drift region (18) that extend downward from a surface region to a substrate (11) and a dielectric region (20) that exponentially tapers outward from the cylindrical drift region as the drift region approaches the substrate. A field plate electrode (12) is disposed on the dielectric region. Alternatively, the gate electrode (40, 46) may be disposed on the dielectric region, optionally with an underlying field plate electrode (48).

17 Claims, 5 Drawing Sheets

SEMICONDUCTOR DEVICE STRUCTURE WITH A TAPERED FIELD PLATE AND CYLINDRICAL DRIFT REGION GEOMETRY

This application claims priority from International Application PCT/IB2006/050398 filed on Feb. 7, 2006 titled, "Semiconductor Device Structure with a Tapered Field Plate and Cylindrical Drift Region Geometry," of Theodore Letavic and John Petruzzello; said International Application claims priority to U.S. Provisional Application No. 60/651,105 filed Feb. 8, 2005 and U.S. Provisional Application No. 60/737,718 filed Nov. 17, 2005.

The present invention relates generally to semiconductor devices, and more specifically relates to a semiconductor device structure having a tapered field plate and cylindrical drift region geometry.

Semiconductor structures continue to evolve to meet the specific needs of targeted applications. One such area where this evolution is occurring involves next generation trench MOS (metal oxide semiconductor) devices, which for instance may be used for voltage regulation modules (VRMs) of desktop motherboards (e.g., dc-dc conversion point of load VRM's), low-ohmic automotive applications, medium voltage (<150V) SMPS power consumption, etc.

U.S. Patent Publication US2008/0128743 A1 published Jun. 5, 2008 (application Ser. No. 11/629,766) titled, "High-Voltage Device Structure" of Theodore Letavic and John Petruzzello, which is hereby incorporated by reference, discloses a device structure that is depleted by MOS field plates where the dielectric layer between the semiconductor drift region and the field plate has a thickness which varies linearly in the longitudinal direction. The structure can be viewed as stripes of semiconductor and dielectric field plate structures which are built into the depth of a semiconductor wafer. The semiconductor drift region has a constant doping profile and the dielectric layer thickness is non-uniform through the depth of the trench to achieve a constant longitudinal electric field.

These "striped" geometry devices have good Rsp-BVds performance. However, because they must be terminated on the surface of the silicon, area is consumed. In addition, the linear variation of the dielectric thickness results in diminishing performance for breakdown voltages under 150 Volts. Accordingly, a need exists for a longitudinal semiconductor structure design that is self terminating and performs well for breakdown voltages under 150 Volts.

The present invention address the above mentioned problems, as well as others, by providing a longitudinal semiconductor structure design that is self terminating and performs well for breakdown voltages under 150 Volts. A semiconductor device is presented that encompasses the construction of a medium or high-voltage device in a vertical orientation in which the device drift region is depleted by action of MOS field plates formed in vertical trenches. The semiconductor drift region is designed to have a constant longitudinal electric field and a constant rate of transverse ionization. To achieve this, the thickness of the dielectric between the (cylindrical) drift region and the field plate has an exponential variation with longitudinal direction.

In a first aspect, the invention provides a semiconductor structure, comprising: a substrate; a vertically oriented cylindrical drift region that resides above the substrate; an exponentially tapered field plate located about the cylindrical drift region; and a dielectric region located between the cylindrical drift region and the exponentially tapered field plate.

In a second aspect, the invention provides a vertically oriented self terminating discrete trench MOS device, comprising: a cylindrical drift region that extend downward from a surface region to a substrate; and a dielectric region that exponentially tapers outward from the cylindrical drift region as the drift region approaches the substrate.

In a third aspect, the invention provides a vertically oriented semiconductor device, comprising, a cylindrical drift region that extends from a surface region to a substrate, wherein the cylindrical drift region is depleted by action of a MOS field plate located about the cylindrical drift region, wherein the MOS field plate is tapered outwardly from the cylindrical drift region as the drift region approaches the substrate.

These and other features of this invention will be more readily understood from the following detailed description of the various aspects of the invention taken in conjunction with the accompanying drawings in which.

Figure 5:
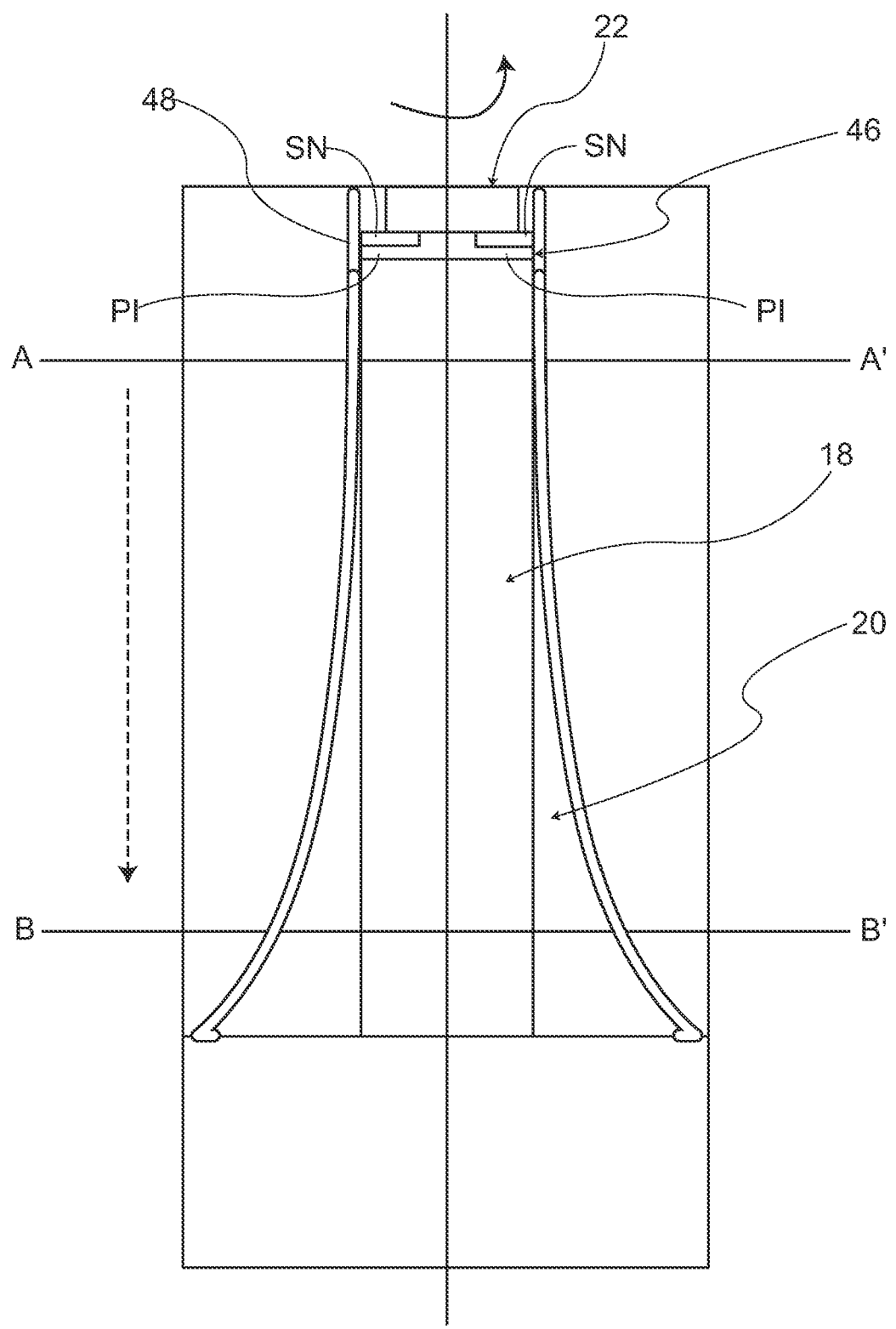

FIG. 5 a cross-sectional view of a vertically oriented device having an alternative conventional trench gate configuration constructed in accordance with the present invention.

Figure 1:
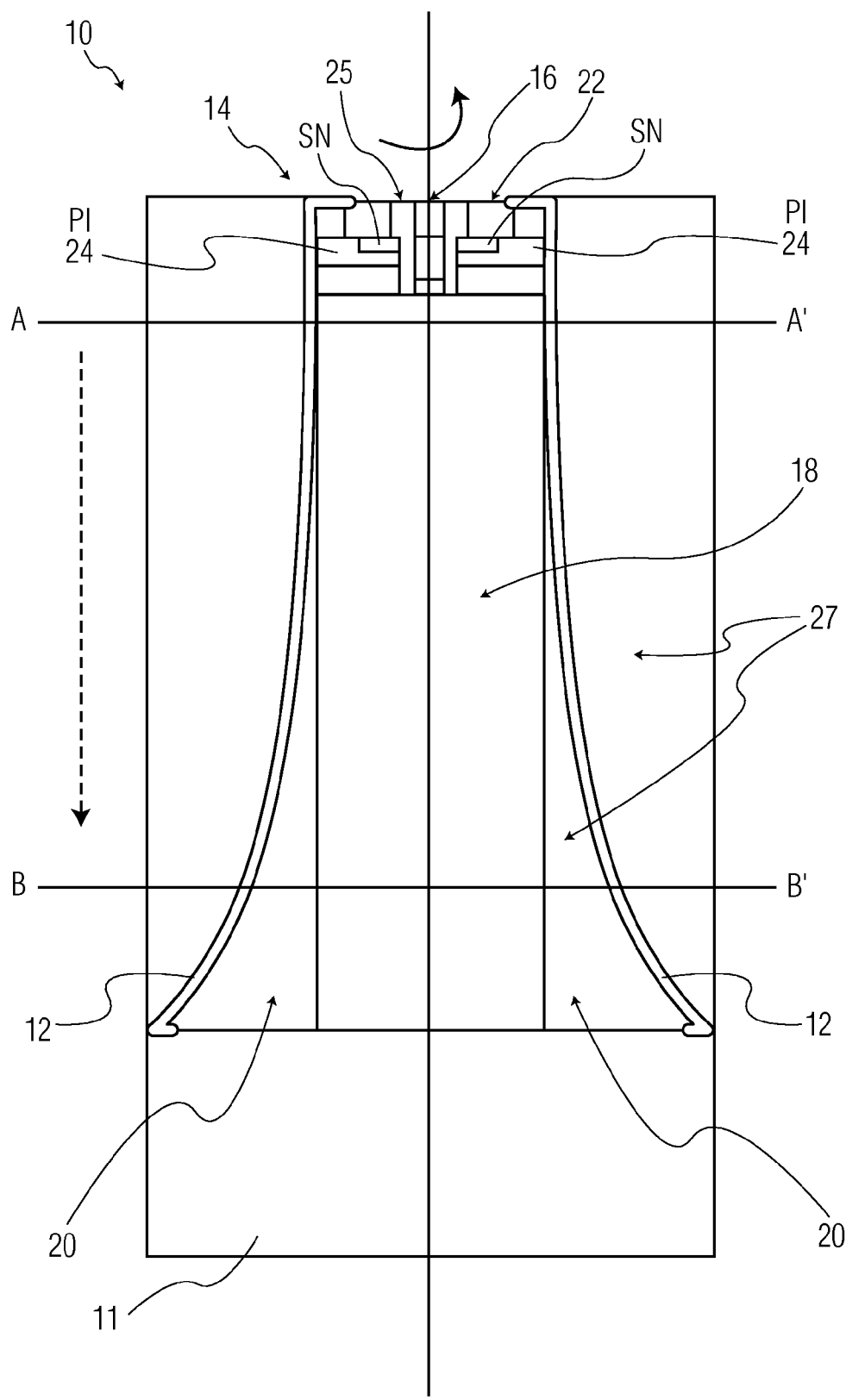
FIG. 1 depicts a cross-sectional view of a vertically oriented device constructed in accordance with the present invention.

Referring now to FIG. 1, a cross-section of a vertically oriented cylindrical semiconductor structure 10 in accordance with the present invention is shown. The structure comprises a medium voltage (<150V) device that supports voltage by depletion from a "horn-shaped" metal field plate structure 12 formed about the sidewall of a low k dielectric 27 within a cylindrical mesa etched in a silicon wafer. The device is a discrete trench MOS device that is self-terminated, thus eliminating the need for a termination area.

As can be seen, the structure 10 is formed in a silicon wafer and includes: a surface region 14 at the gate/source planar level; a cylindrical n+ drift region 18; a horn-shaped metal field plate structure 12 located about drift region 18; a low k dielectric region 20 between the metal field plate structure 12 and drift region 18; and an n+ substrate 11 (i.e., drain). A silicon mesa is thus essentially formed from the tapered dielectric region 20 and cylindrical n+ drift region 18 within a silicon slice. The silicon mesa is thus the silicon cylinder formed by reflection of drift region 18 around the z-axis, the axis of symmetry. In this embodiment, a recessed polysilicon gate structure 16 is provided in the surface region 14 of the silicon wafer. The n+ drift region 18 can be, e.g., a silicon substrate or an n-type epitaxial layer. The thickness of the dielectric region 20 between the metal field plate structure 12 and the cylindrical silicon drift region 18 increases exponentially through the thickness of the trench in the direction of A to B (forming a horn-shape structure). The metal field plate structure 12 is shorted to the source (SN) 22 of the MOS for optimal switching characteristics. In this recessed-gate n-channel MOS device, the source 22, p-inversion (PI) 24 and recessed gate 16 are surrounded by gate oxide 25. This provides very low total gate charge and low Cdg (drain-to-gate capacitance, also known as Miller Capacitance).

The cylindrical silicon drift region 18 may for instance have a radius of 1-3 μm, and the low-k dielectric region 20 may have a maximum thickness of in the range of 1-2 μm, depending on application voltage and low-k dielectric constant. Silicon drift region radii of 0.5 to 5.0 μm have been investigated, with drift lengths (trench depths) on the order of 5-10 µm. The exponential tapering of the dielectric region 20 is specified to result in a uniform longitudinal electric field (vertically or longitudinally in the direction of A to B shown in FIG. 1) of approximately 15-22 V/µm. The doping in the n+ drift region 18 is specified by a desired constant total ionization integral in the transverse direction (i.e., the lateral direction). For a typical 150V device, a silicon mesa radius of 2.5 µm results in a volume concentration of approximately 1 e17 cm-3 and a maximum dielectric thickness of 2 µm (for silicon dioxide).

Because the ideal dielectric thickness variation in the longitudinal direction has exponential dependence, the dielectric region 20 in structure 10 is designed with an exponential taper. In addition, a low-k dielectric 27 is utilized to improve the Rsp (specific on-resistance) by reducing pitch, which is particularly the case in cylindrical device designs.

This device structure 10 reduces the achievable specific on-resistance for vertical trench MOS devices by at least a factor of two over deep-uv trench MOS device concepts, while using conventional i-line photolithography and process tools. The structure 10 can be fabricated with standard or (deep-uv) photolithography, with the optimum layout, doping, and dielectric thickness determined by the photolithographic node. The device performance is completely controlled by a dielectric trench etch.

Etching of cylindrical posts into a semiconductor substrate may be performed, for instance, with doping set by controlled epitaxy or a fixed doping level. Trench (cylinder) etch is followed by the formation of depleting structures by deposition or shaping of the dielectric 27 and metal field plate structure 12 along the sidewall of the trench. The dielectric layer 27 can be silicon dioxide or any low-k dielectric. The longitudinal variation of the dielectric is exponential with distance (down) the trench sidewall. A recessed gate structure or conventional trench MOS gate can be used for channel formation of the vertical transistor. The substrate 11 can be n-type or p-type to construct DMOS or LIGBT structures. Opposite polarities may be used for pchannel device construction.

The relationship of the silicon cylinder radius, doping, and ideal exponential dielectric thickness variation can be expressed as $$T_{die}[z] = (t_{si} + t_{gate}) * \text{Exp}[(2E_z e_o e_{die} z)/(qN_d t_{si}^2)] - t_{si}$$

where $t_{die}$ is the dielectric layer thickness as a function of longitudinal direction (z), $t_{si}$ is the radius of the silicon mesa, $t_{gate}$ is the gate oxide thickness (along the P type inversion "PI" region), $E_z$ is the specified value of longitudinal electric field, $N_d$ is the doping of the silicon mesa, and $e_{die}$ is the dielectric constant of the dielectric material. Design of the device may proceed by defining the contribution of the longitudinal and transverse ionization integrals to the total (0.25 and 0.75, respectively) and solving the above equation for the field plate design as a function of silicon cylinder radius. The use of the low-k dielectric 27 greatly reduces the maximum thickness of the dielectric layer for a given BVds (in the above equation).

The above equation can be further simplified for design practice as $$Rsp = \{(L_d(2t_si + 2t_{die}))/(qu_n N_d(2*t_{si}))\}$$

$$T\text{die} = t\text{gate} + ((E_z eoe_{die} L_d)/(qNdt_{si}))$$

where Ld is the depth of the cylindrical mesa into the silicon, set by the desired Ez and BVds, and Rsp is the specific on-resistance.

Figure 2:
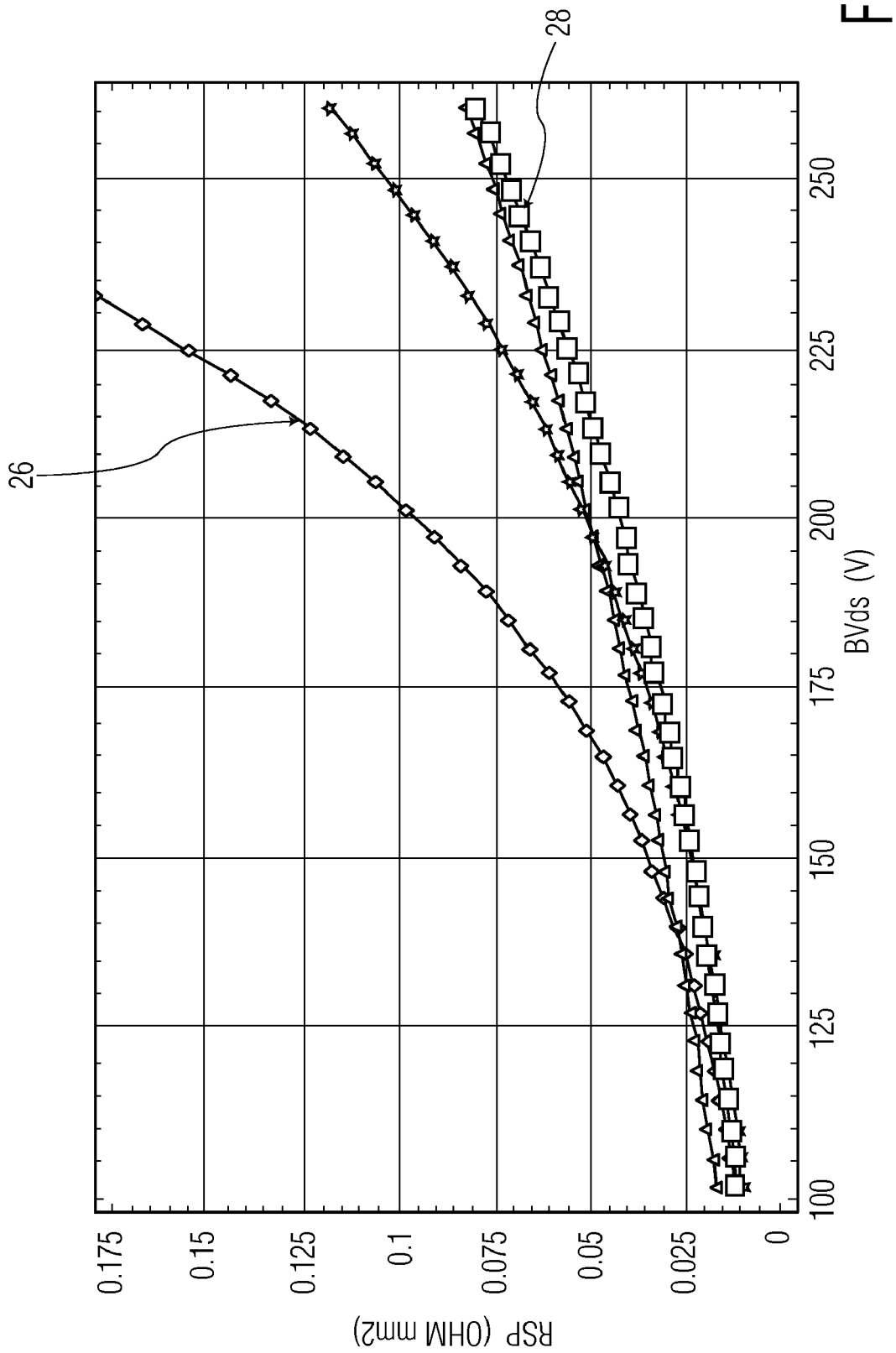
FIG. 2 depicts a chart showing the analytic calculations of Rsp vs BVds for device construction of FIG. 1.

FIG. 2 shows some calculated BVds-Rsp results for medium voltage exponentially tapered dielectric devices, in which Rsp (ohms mm2) is provided along the y axis and BVds (volts) is provided along the x axis. The top curve 26 shows results for a radius tsi=0.25 µm, and the bottom curve 28 shows results for a tsi=2.0 µm, where the low k dielectric $e_{die}$=1.6. Very competitive Rsp values of less than 0.01 ohm mm2 are achieved for devices using this design technique at a BVds of 100V. In addition, FIG. 2 shows the effect of process ground rules on Rsp where it is demonstrated that very low Rsp values can be obtained for both conventional (I-line) and aggressive (deep-uv) photolithographic rules. This is a key finding, in that low-cost processing can provide device performance almost identical to that of much more expensive technology nodes. This shows that the exponential taper is desirable for voltages <150V, the exponential increase in thickness to force the constant longitudinal electric field results in dramatic increase in Rsp above 150V (undesirable).

Figure 3:
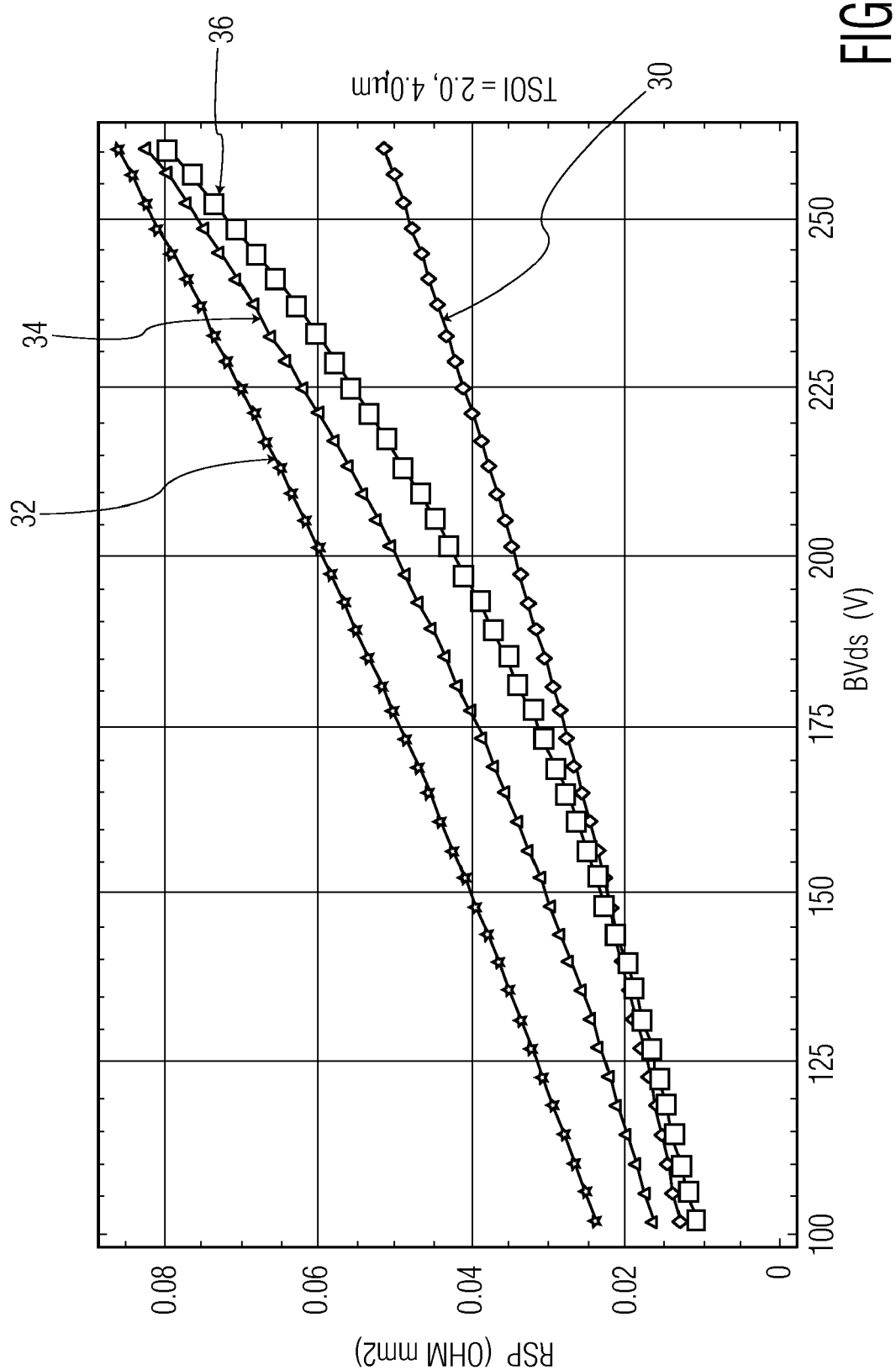
FIG. 3 depicts a chart showing a comparison of the device construction of FIG. 1 with the prior art.

FIG. 3 depicts a comparison with the design technique of the prior art using linear striping for the medium voltage breakdown range, in which Rsp (ohms) is provided along the y axis and BVds (volts) is provided along the x axis. In this case, curve 30 depicts results for a linear taper of 2 µm total thickness, curve 32 depicts results for an exponential taper having a 4 µm total Si thickness, curve 34 depicts results for an exponential taper having a 4 µm total thickness, and curve 36 depicts results for an exponential taper having a 2 µm total thickness. This shows that the cylindrical geometry with exponential taper has a lower Rsp than a striped geometry with linear taper in this breakdown voltage regime for a recessed gate design. As noted, the cylindrical (horn-shaped) design has the additional benefit of self-termination, i.e., no surface area of silicon is consumed to terminate the electric field lines, so a more cost effective solution is provided at the same BVds and technology node.

Figure 4:
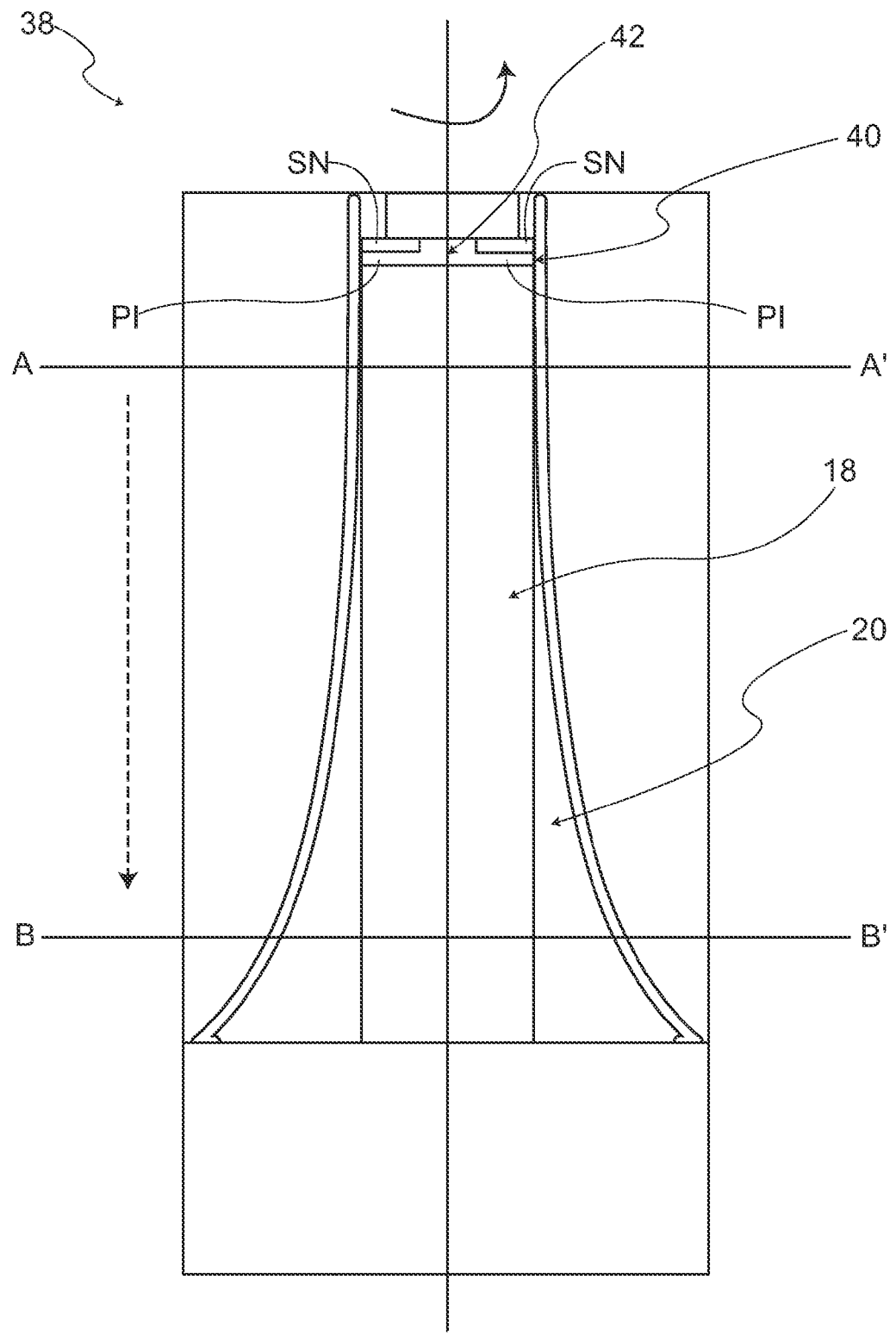
FIG. 4 depicts a cross-sectional view of a vertically oriented device using a conventional trench gate configuration constructed in accordance with the present invention.

Several embodiments of the cylindrical tapered dielectric design are possible, depending on the photolithographic technology node that is selected. If deep-uv photo is used, then improved performance may be obtained for structures that do not leave room for the recessed gate, and the gate is formed in conventional TrenchMOS techniques. FIGS. 4 and 5 show variations of FIG. 1.

In FIG. 4, an embodiment of a tapered dielectric device 38 using conventional trench gate formation on the sidewall of the PI region 42 is shown. As can be seen, the MOS gate 40 is formed on the exterior sidewall of the PI region 42. Typical silicon mesa radii are less than 1 µm for this approach.

In FIG. 5, a further embodiment of a tapered dielectric device using conventional trench gate formation on the sidewall of the PI region is shown. Typical silicon mesa radii are less than 1 µm for this approach. The PS gate 46 is split, and a transition to a metal field plate 48 is shown, connected to the source in the third dimension. This lowers the Cdg of the structure of FIG. 4 due to the connection of the field plate to the source electrode.

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

The invention claimed is:

1. A semiconductor structure, comprising: a substrate; a vertically oriented cylindrical drift region that resides above the substrate; an exponentially tapered field plate located about the cylindrical drift region; and a dielectric region located between the cylindrical drift region and the exponentially tapered field plate.

2. The semiconductor structure of claim 1, wherein the substrate acts as a drain.

3. The semiconductor structure of claim 1, further comprising a recessed gate structure on a surface of the semiconductor structure.

4. The semiconductor structure of claim 1, wherein the exponentially tapered field plate is coupled to a source on a surface of the semiconductor structure.

5. The semiconductor structure of claim 1, wherein the exponentially tapered field plate increases in diameter as the field plate projects away from a surface of the semiconductor structure toward the substrate.

6. The semiconductor structure of claim 1, wherein the exponentially tapered field plate is tapered to result in a substantially uniform longitudinal electrical field.

7. The semiconductor structure of claim 1, wherein the exponentially tapered field plate is tapered to result in a substantially constant rate of transverse ionization.

8. The semiconductor structure of claim 1, further comprising a poly silicon trench gate formed on a sidewall of a P-type inversion region proximate a surface of the semiconductor structure.

9. The semiconductor structure of claim 8, wherein the poly silicon trench gate is split.

10. A vertically oriented self terminating discrete trench metal oxide semiconductor device, comprising: a cylindrical drift region that extend downward from a surface region to a substrate; and a dielectric region that exponentially tapers outward from the cylindrical drift region as the drift region approaches the substrate.

11. The MOS device of claim 10, wherein the dielectric region is defined by a field plate that exponentially tapers outward from the cylindrical drift region as the drift region approaches the substrate.

12. The MOS device of claim 11, wherein the field plate is coupled to a source on the surface region.

13. The MOS device of claim 10, wherein the substrate acts as a drain.

14. The MOS device of claim 10, further comprising a gate structure recessed into the surface region.

15. The MOS device of claim 10, further comprising a polysilicon trench gate formed on a sidewall of a P-type inversion region at the surface region.

16. The MOS device of claim 15, wherein the polysilicon trench gate is split.

17. A vertically oriented semiconductor device, comprising, a cylindrical drift region that extends from a surface region to a substrate, wherein the cylindrical drift region is depleted by action of a metal oxide semiconductor (MOS) field plate located about the cylindrical drift region, and wherein the MOS field plate is exponentially tapered outwardly from the cylindrical drift region as the drift region approaches the substrate.

* * * * *